United States Patent

Fam et al.

Patent Number: 6,099,902
Date of Patent: Aug. 8, 2000

[54] METHOD OF DETERMINING A TIME TO CLEAN A LOW PRESSURE CHEMICAL VAPOR DEPOSITION (LPCVD) SYSTEM

[75] Inventors: Jumn-Min Fam; Tang Yu, both of Hsinchu Hsien; Eddie Chen, Hsinchu, all of Taiwan

[73] Assignee: United Silicon Incorporated, Hsinchu, Taiwan

[21] Appl. No.: 09/186,530

[22] Filed: Nov. 5, 1998

[30] Foreign Application Priority Data

Jul. 18, 1998 [TW] Taiwan ................................. 87111747

[51] Int. Cl.$^7$ .................................................. C23C 16/00
[52] U.S. Cl. ......................................... 427/248.1; 427/294
[58] Field of Search ........................... 427/248.1, 255.11, 427/294; 438/584, 680, 905

[56] References Cited

U.S. PATENT DOCUMENTS

| 4,357,179 | 11/1982 | Adams et al. | 427/248.1 |
| 4,540,607 | 9/1985 | Tsao | 427/253 |
| 4,755,486 | 7/1988 | Treichel et al. | 427/70 |
| 5,227,334 | 7/1993 | Sandhu | 437/190 |

*Primary Examiner*—Shrive Beck
*Assistant Examiner*—Bret Chen
*Attorney, Agent, or Firm*—J.C. Patents; Jiawei Huang

[57] ABSTRACT

A method for accurately determining a time to clean a LPCVD system is disclosed, in which gas flow readings of the gas supplying source from a mass flow meter (MFM) are recorded during the depositing process. The gas flow volume of the gas supplying source read from the MFM decreases as the congestion in the vacuum route of the LPCVD system increases. Based on the established relationship, an accurate time for cleaning the LPCVD system can be determined, so as to avoid product defects due to an excessive deposition.

3 Claims, 3 Drawing Sheets

METHOD OF DETERMINING A TIME TO CLEAN A LOW PRESSURE CHEMICAL VAPOR DEPOSITION (LPCVD) SYSTEM

CROSS-REFERENCE TO RELATED APPLICATION

This application claims the priority benefit of Taiwan application Ser. No. 87111747, filed Jul. 18, 1998, the full disclosure of which is incorporated herein by reference.

BACKGROUND OF THE INVENTION

1. Field of Invention

The present invention generally relates to a method of fabricating semiconductor devices, and more particularly to a method of determining a time to clean a low pressure chemical vapor deposition (LPCVD) system.

2. Description of Related Art

Chemical vapor deposition (CVD) is a widely-used thin film technology in fabricating semiconductor devices. The CVD method is typically performed in a reactor to solidify reactive gases into solid-state products to deposit a thin film on a wafer surface during a chemical reaction. Many thin films required in semiconductor devices are fabricated using the CVD method. For example, conductors, semiconductors, or dielectrics can typically be fabricated by using the CVD method. Also, the thin films are produced through a chemical reaction of gases by using the CVD method. The crystallinity, stoichiometry and other material characteristics of the thin films produced are therefore superior to those produced using a sputtering method. It is no wonder that the CVD method has become one of the most important technologies for deposition of thin films in fabricating semiconductor devices.

Basically, the CVD method can be categorized into two types depending on the operating pressure required by the CVD equipment, including an atmospheric pressure CVD (APCVD) and a low pressure CVD (LPCVD). The LPCVD generally has reactions undertaken at a lower pressure. The deposited thin films therefore have a better step coverage due to a slower depositing speed.

FIG. 1 shows a schematic block diagram of a conventional low pressure chemical vapor deposition (LPCVD) system, in which a reactor 100, a gas transporting system 102, an exhaust system 104, a process control system 106, and a vacuum pump 108 to provide a required vacuum level, are depicted. A deposition performed by using the LPCVD method generally requires a pressure of about 100 Torr or below, which is controlled by the vacuum pump 108. Reactive gases are pumped into the reactor 100 through the gas transporting system 102 to initiate a chemical reaction to deposit a solid-state product on a wafer surface. The pressure in the reactor 100 during a depositing process can be regulated by the vacuum pump 108 and a gas supplying source 110, so that the pressure in the reactor 100 can be maintained at a desired level. When the gas pressure in the reactor 100 is too low, the gas supplying source 110 fills the gap by supplying more gases into the reactor 100. On the other hand, when the gas pressure in the reactor 100 is too high, the excessive gases are pumped out through the exhaust system 104 by the vacuum pump 108. Furthermore, the processing gases in the reactor 100 after reaction are pumped out from the reactor 100. Solid deposition particles which are not deposited on the wafer surface accumulate in a particle filter/trap 112 during an exhausting process.

As the number of processing batches increases, the solid deposition particles not deposited on the wafer surface will gradually congest the particle filter/trap 112. When there is an insufficient gas pressure in the reactor 100, the gas supplying source 110 can not quickly provide the gases required to the reactor 100. On the other hand, when there is an excessive gas pressure in the reactor 100, the vacuum pump 108 can not smoothly pump out the gases out of the reactor 100. Because of the constraint of the LPCVD equipment, it is very difficult to accurately determine a time to clean the vacuum route, particularly, the particle filter/trap 112. When the thin films produced are too thick, which implies congestion in the vacuum route of the LPCVD system has occurred, it is too late to clean the vacuum system because the abnormal products need to be disposed of. Although this problem can be solved by increasing the cleaning frequency for the LPCVD system, it reduces, however, the throughput of the LPCVD system because idle time of the system is be increased.

SUMMARY OF THE INVENTION

It is therefore an objective of the present invention to provide a method for accurately determining a time to clean the LPCVD system, so as to prevent producing defective products due to the congestion in the vacuum route of the LPCVD system.

It is another objective of the present invention to provide a method for accurately determining a time to clean the LPCVD system, so as to reduce the frequency of cleaning the LPCVD system so that the throughput of the LPCVD system is not reduced.

In accordance with the foregoing and other objectives of the present invention, a method for accurately determining a time to clean the LPCVD system is provided, in which gas flow readings of the supplying gas source from a mass flow meter (MFM) are recorded during the depositing process. The gas flow volume of the gas supplying source read front the MFM decreases as the congestion in the vacuum route of the LPCVD system increases. Based on the established relationship, an accurate timing can be determined to clean the LPCVD system, so as to avoid the product defects due to an excessive deposition.

According to the present invention, the relationship between the gas flow volume of the gas supplying source read from the mass flow meter (MFM) and depositing batches processed can be established through a graphic diagram, in which a batch number having a zero gas flow reading can be determined. Before reaching the batch number having a zero gas flow reading, the LPCVD system can be cleaned, so that a desired gas pressure within the reactor can be controllably regulated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated In the drawings.

DESCRIPTION OF THE PREFERRED EMBODIMENTS

Figure 1:
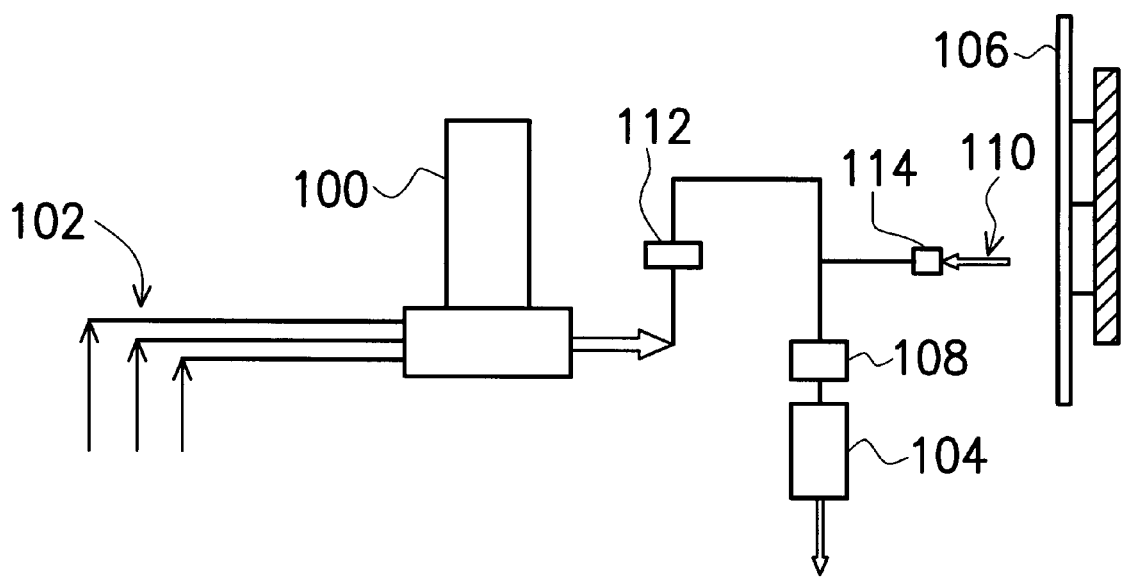
FIG. 1 is a schematic block diagram of a conventional low pressure chemical vapor deposition (LPCVD) system.

Reference will now be made in detail to the present preferred embodiments of the invention, examples of which are illustrated in the accompanying drawings. Wherever possible, the same reference numbers are used in the drawings and the description to refer to the same or like parts.

Figure 2:
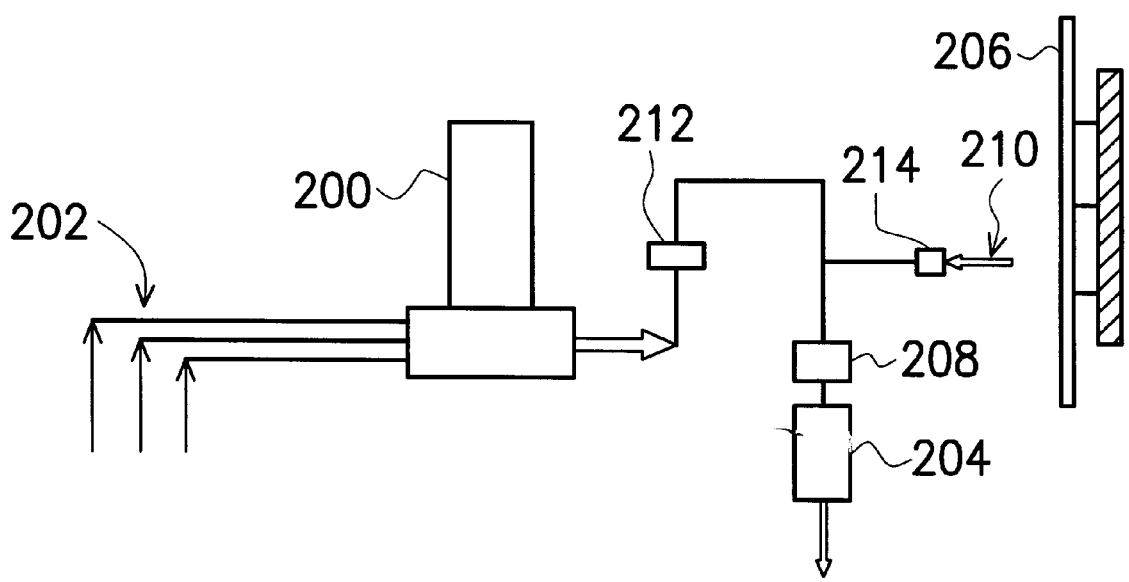
FIG. 2 is a schematic block diagram of a low pressure chemical vapor deposition (LPCVD) system according to a preferred embodiment of the present invention.

Refer to FIG. 2, where a schematic block diagram of a low pressure chemical vapor deposition (LPCVD) system is depicted according to a preferred embodiment of the present invention. The LPCVD system includes a reactor 200, for example, a furnace tube, a gas transporting system 202, an exhaust system 204, a process control system 206, and a vacuum pump 208 used to provide the required vacuum level.

Generally, a depositing process in the reactor 200 by using the LPCVD method requires a pressure of 100 Torr or below, which is controlled by the vacuum pump 208. Reactive gases are transported to the reactor 200 through the gas transporting system 202 to initiate a chemical reaction to deposit a solid-state product on the wafer surface. The pressure in the reactor 200 during the depositing process is regulated by the vacuum pump 208 and a gas supplying source 210 of, for example, an inert gas such as nitrogen, so that the pressure in the reactor can be maintained at a desired level. When the gas pressure in the reactor 200 is too low, the gas supplying source 210 fills the gap by supplying more gases into the reactor 200 through a flow control from the mass flow meter 214. The mass flow meter 214 is coupled to a plotting means 218, which can extract the gas volume read from the mass flow meter for plotting versus processed batch sequence number. On the other hand, when the gas pressure in the reactor 200 is too high, excessive gases are pumped out via the exhaust system 204 by the vacuum pump 208. Also, the processing gases in the reactor 200 after reaction are pumped out from the reactor 200. Solid-state products not deposited on the wafer surface during the depositing process accumulate in a particle filter/trap 212 during the exhausting process.

As the number of depositing batches increases, the solid-state products not deposited on the wafer surface during the depositing process gradually congest the particle filter/trap 212. Therefore, the gas flow volume from the gas supplying source 210 reduces as the congestion due to particles not deposited on the wafer surface during the depositing process in the particle filter/trap 212 increases. Therefore, gas flow readings from the MFM, which monitor the flow of the gas supplying source 210, can be used to accurately determine the time to clean the LPCVD system.

Figure 3:
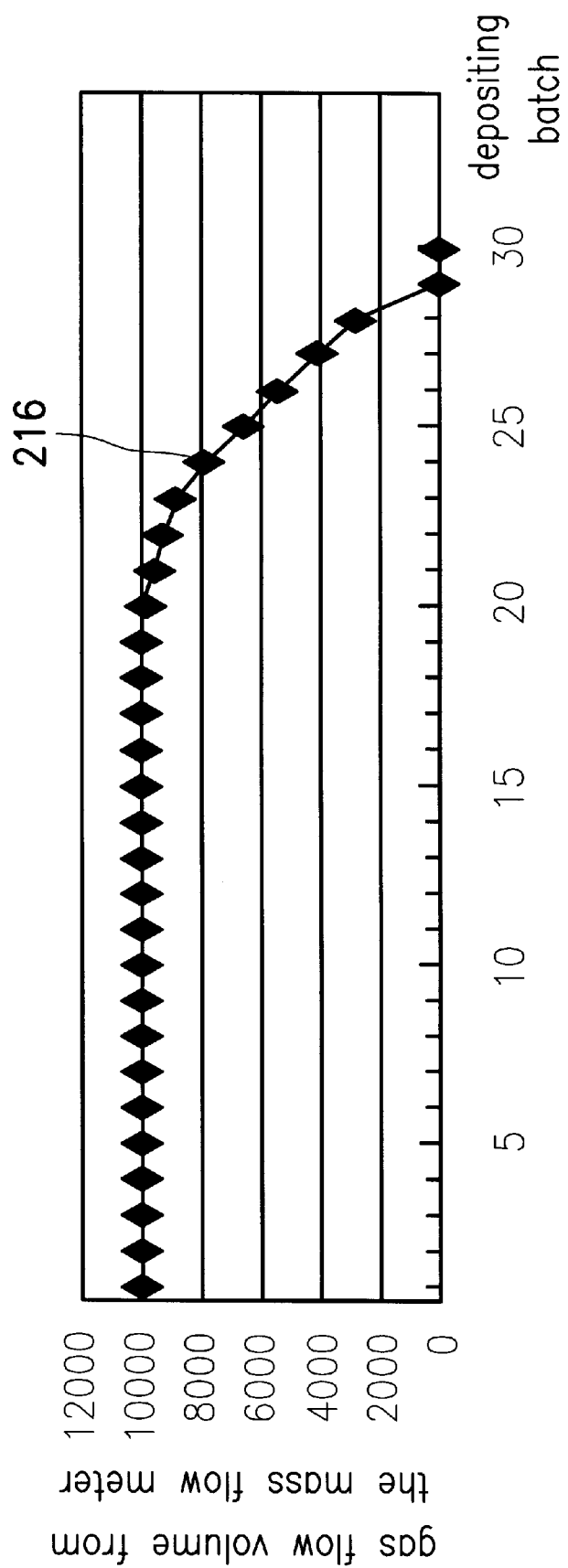
FIG. 3 is a diagram showing the relationship between the gas flow volume of the gas supplying source read from the mass flow meter (MFM) and depositing batches processed in a depositing system.

Refer to FIG. 3, a curve 216 is depicted showing the relationship between the gas flow volume of the gas supplying source 210 read from the mass flow meter (MFM) 214 and depositing batches processed in a depositing system. As shown in FIG. 3, the gas flow volume from the gas supplying source 210 to the reactor 200 maintains a desired level before batch 20. After batch 21, the gas flow olume from the gas supplying source 210-gradually decreases. A zero reading of the gas flow is reached at batch 29, where the thin films deposited are detected as abnormal compared with those at batch 28 or earlier.

Figure 4:
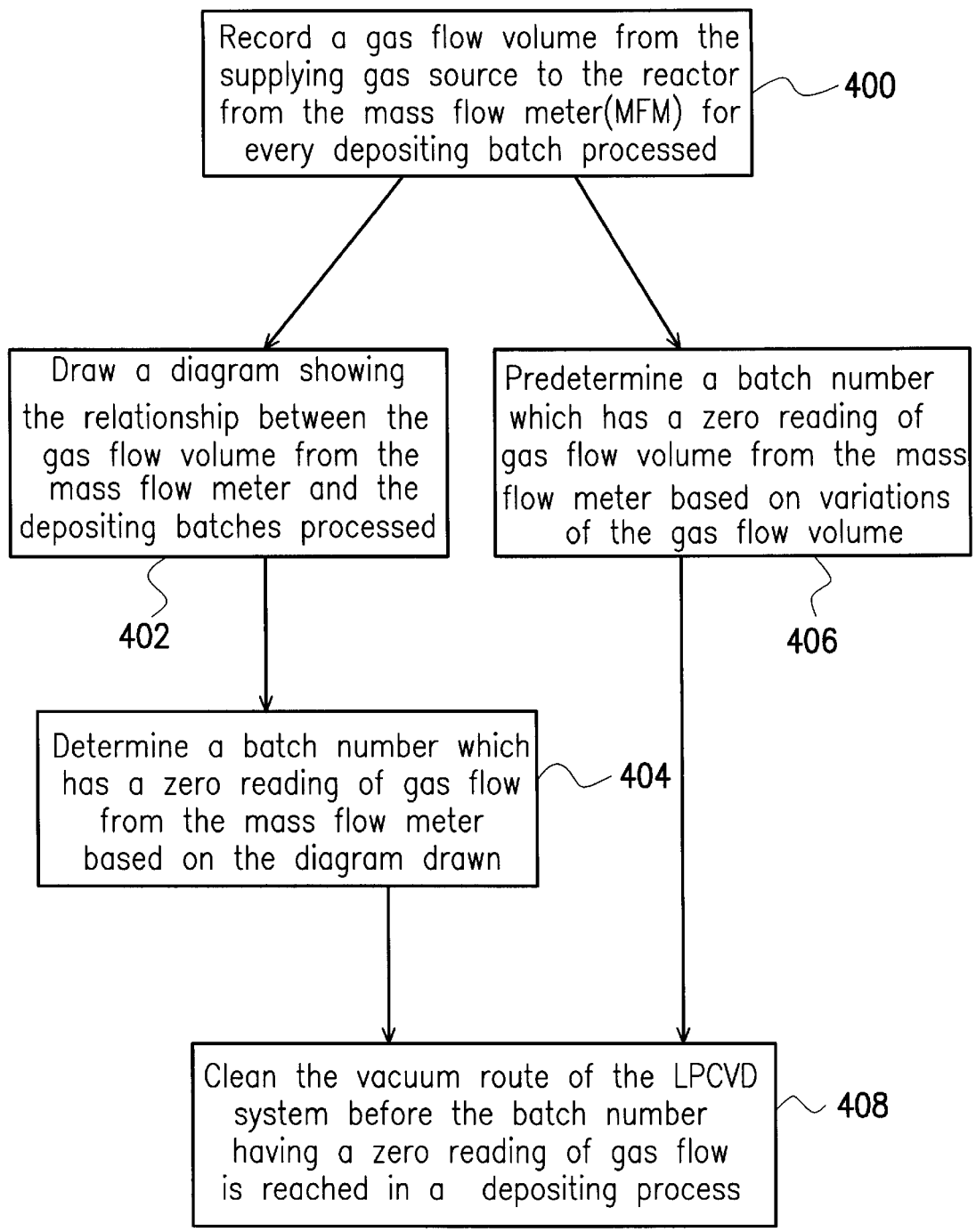
FIG. 4 is a flow chart showing a method for accurately determining a time to clean the LPCVD system according to a preferred embodiment of the present invention.

As shown in FIG. 4, where a flow chart showing a method to accurately determine a time to clean the LPCVD system is depicted according to a preferred embodiment of the present invention. Readings of the gas flow volume from the gas supplying source 210 to the reactor 200 through the mass flow meter (MFM) 214 are recorded for every depositing batch processed (Box 400). The readings of the gas flow volume from the mass flow meter 214 versus the depositing batches processed are used to draw a diagram (Box 402), in which a batch number with a zero reading of gas flow is determined (Box 404). Alternately, the batch number with a zero reading of the gas flow from the mass flow meter 214 can be predetermined based on variations of the gas flow (Box 406), so that the LPCVD system can be cleaned before the batch number having a zero reading of the gas flow is reached (Box 408).

Therefore, the present invention can be characterized by its ability to accurately determine a time to clean the LPCVD system to avoid the deposited products from being disposed of due to product defects. The present invention can also be characterized by its ability to accurately determine a time to clean the LPCVD system so that the cleaning frequency for the LPCVD system is not increased and the throughput is not decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for determining a time to clean a low pressure chemical vapor deposition (LPCVD) system, wherein the LPCVD system comprises a gas supplying source, a reactor, and a mass flow meter, wherein the mass flow meter is used to control the gas flow from the gas supplying source to regulate the gas pressure in the reactor, the method comprising the steps of:

recording a gas flow volume from the mass flow meter for every depositing batch processed;

drawing a diagram showing the relationship between the gas flow volume from the mass flow meter and the depositing batches processed;

determining a batch number which has a zero reading of gas flow from the mass flow meter based on the diagram drawn; and cleaning the vacuum route of the LPCVD system before the batch number having a zero reading of gas flow is reached in a depositing process.

2. A method for determining a time to clean a low pressure chemical vapor deposition (LPCVD) system, wherein the LPCVD system comprises a gas supplying source, a reactor, and a mass flow meter, wherein the mass flow meter is used to control the gas flow from the gas supplying source to regulate the gas pressure in the reactor, the method comprising the steps of:

recording a gas flow volume from the mass flow meter for every depositing batch processed;

predetermining a batch number which has a zero reading of gas flow volume from the mass flow meter based on variations of the gas flow volume; and cleaning the vacuum route of the LPCVD system before the batch number having a zero reading of gas flow is reached in a depositing process.

3. A method for determining a time to clean a chemical vapor deposition (CVD) system in a depositing process, wherein the CVD system comprises a gas supplying source, a reactor, and a mass flow meter, in where the mass flow meter is used to control the gas flow from the gas supplying source to regulate the gas pressure in the reactor, the method comprising:

recording a gas flow volume from the mass flow meter for each processed depositing batch;

plotting the gas flow volume from the mass flow meter versus each processed depositing batch to form a diagram;

determining a batch number of the processed depositing batch which has a zero reading of the gas flow from the mass flow meter by extrapolating the diagram; and cleaning the CVD system before the batch number having a zero reading of the gas flow is reached in the depositing process.

* * * * *